US010290885B2

(12) United States Patent
Matsumoto et al.

(10) Patent No.: US 10,290,885 B2
(45) Date of Patent: May 14, 2019

(54) APPARATUS FOR MEASURING AN IMPEDANCE OF FUEL CELL AND METHOD OF MEASURING AN IMPEDANCE OF FUEL CELL

(71) Applicant: NISSAN MOTOR CO., LTD., Yokohama-shi, Kanagawa (JP)

(72) Inventors: Michihiko Matsumoto, Kanagawa (JP); Kotaro Akashi, Kanagawa (JP); Yohei Kaneko, Kanagawa (JP); Masashi Sato, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 325 days.

(21) Appl. No.: 15/324,842

(22) PCT Filed: Jul. 11, 2014

(86) PCT No.: PCT/JP2014/068636
§ 371 (c)(1),
(2) Date: Jan. 9, 2017

(87) PCT Pub. No.: WO2016/006116
PCT Pub. Date: Jan. 14, 2016

(65) Prior Publication Data

US 2017/0214068 A1 Jul. 27, 2017

(51) Int. Cl.
*H01M 8/04* (2016.01)
*H01M 8/04537* (2016.01)
*G01R 27/02* (2006.01)
*G01R 31/40* (2014.01)

(52) U.S. Cl.
CPC ........ *H01M 8/04634* (2013.01); *G01R 27/02* (2013.01); *G01R 31/40* (2013.01); *H01M 8/04* (2013.01); *H01M 8/04544* (2013.01); *H01M 8/04574* (2013.01); *H01M 8/04656* (2013.01)

(58) Field of Classification Search
CPC ............... H01M 8/04634; H01M 8/04; H01M 8/04544; H01M 8/04574; H01M 8/04656; G01R 27/02; G01R 31/40
See application file for complete search history.

(56) References Cited

U.S. PATENT DOCUMENTS

2013/0249562 A1 9/2013 Sakai et al.
2017/0141561 A1* 5/2017 Morita .................... H02H 3/16

FOREIGN PATENT DOCUMENTS

WO WO 2012/077450 A1 6/2012

* cited by examiner

*Primary Examiner* — Anthony R Jimenez
(74) *Attorney, Agent, or Firm* — Foley & Lardner LLP

(57) ABSTRACT

An apparatus for measuring an impedance of a fuel cell is configured to: output an AC current to a fuel cell; and adjust an impedance so that an impedance between the fuel cell and a load device becomes higher than an impedance between a secondary battery and the load device at a frequency of the AC current output to the fuel cell. The apparatus is also configured to: adjust the AC current so that a positive-electrode side AC potential difference matches a negative-electrode side AC potential difference; and calculate an impedance of the fuel cell on the basis of the adjusted AC current and at least one AC potential difference of the positive-electrode side AC potential difference and the negative-electrode side AC potential difference.

5 Claims, 11 Drawing Sheets

APPARATUS FOR MEASURING AN IMPEDANCE OF FUEL CELL AND METHOD OF MEASURING AN IMPEDANCE OF FUEL CELL

TECHNICAL FIELD

The present invention relates to a technique to measure an impedance of a fuel cell.

BACKGROUND ART

WO2012/077450A discloses an internal resistance measuring apparatus that can measure an internal resistance of a fuel cell in a state where an electric power is supplied from the fuel cell to a load. In order to secure measurement accuracy, this internal resistance measuring apparatus outputs an identical AC signal to a positive electrode terminal and a negative electrode terminal of the fuel cell so as to avoid a leakage of a current to a load side. The internal resistance measuring apparatus adjusts amplitude (or magnitude) of each of the AC signals outputted to the respective electrode terminals so that a positive-electrode side AC potential difference, which is obtained by subtracting an electric potential of a middle terminal positioned between the positive electrode terminal and the negative electrode terminal from an electric potential of the positive electrode terminal of the fuel cell, matches a negative-electrode side AC potential difference, which is obtained by subtracting the electric potential described above of the middle terminal from an electric potential of the negative electrode terminal. The internal resistance measuring apparatus then measures an internal impedance of the fuel cell on the basis of the adjusted electric potential difference signal and an AC output signal.

SUMMARY OF INVENTION

However, if the load varies and a frequency of the AC signal matches a frequency of the load variation, the AC signals applied to the positive electrode terminal and the negative electrode terminal of the fuel cell flow to the load side. There is a probability that the impedance of the fuel cell cannot be measured accurately.

It is an object of the present invention to provide a technique that measures the impedance of the fuel cell with accuracy even if the load varies.

An apparatus for measuring an impedance of a fuel cell according to one aspect of the present invention is configured to: output an AC current to a fuel cell; and adjust an impedance so that an impedance between the fuel cell and a load device becomes higher than an impedance between a secondary battery and the load device at a frequency of the AC current outputted to the fuel cell. The apparatus is also configured to: adjust the AC current so that a positive-electrode side AC potential difference matches a negative-electrode side AC potential difference, the positive-electrode side AC potential difference being a difference between an electric potential of the fuel cell on a positive electrode side and a middle electric potential, the negative-electrode side AC potential difference being a difference between an electric potential of the fuel cell on a negative electrode side and the middle electric potential; and calculate an impedance of the fuel cell on the basis of the adjusted AC current and at least one AC potential difference of the positive-electrode side AC potential difference and the negative-electrode side AC potential difference.

Hereinafter, an embodiment of the present invention will be described in detail with reference to the accompanying drawings.

DESCRIPTION OF EMBODIMENTS

Figure 1A:
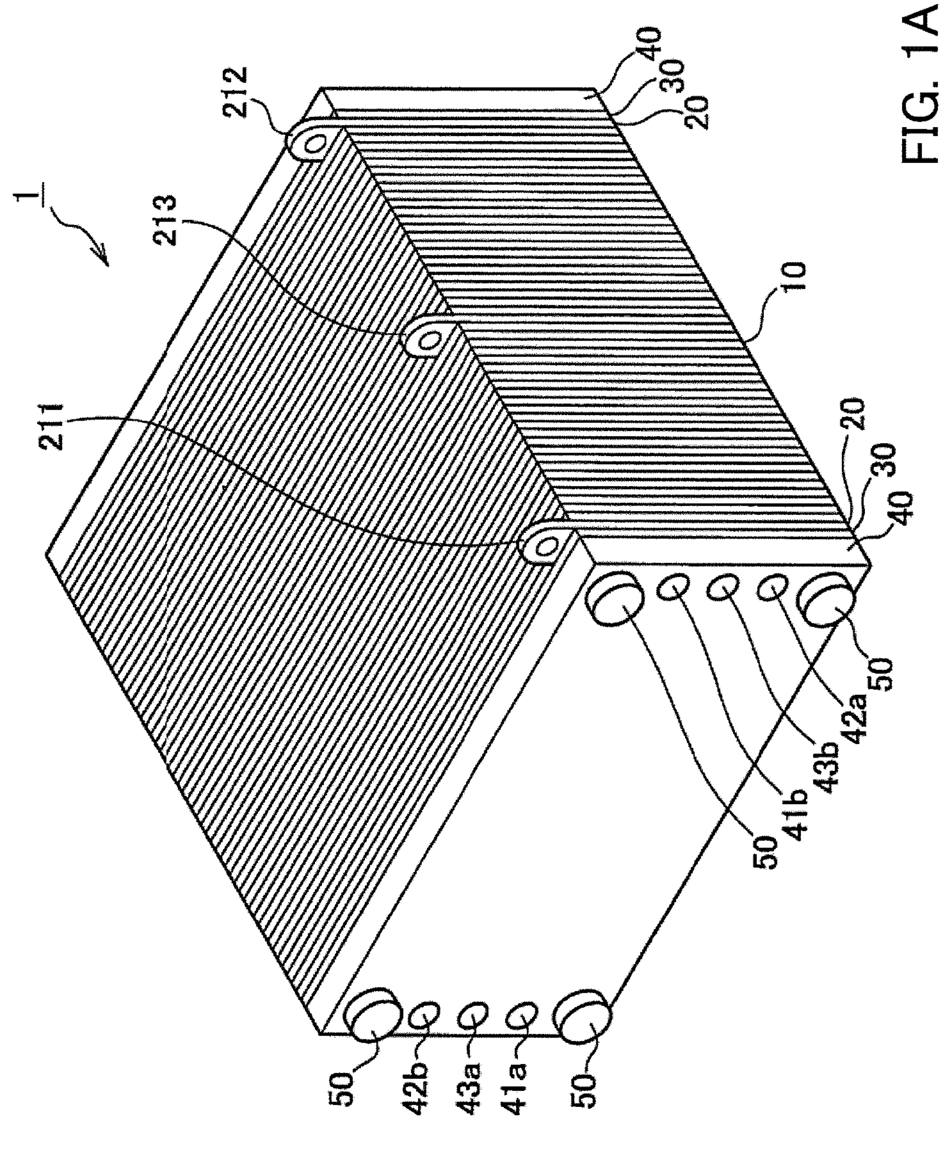
FIG. 1A is an external perspective view of a fuel cell that is a measurement target of an apparatus for measuring an impedance of a fuel cell according to the present invention.
Figure 1B:
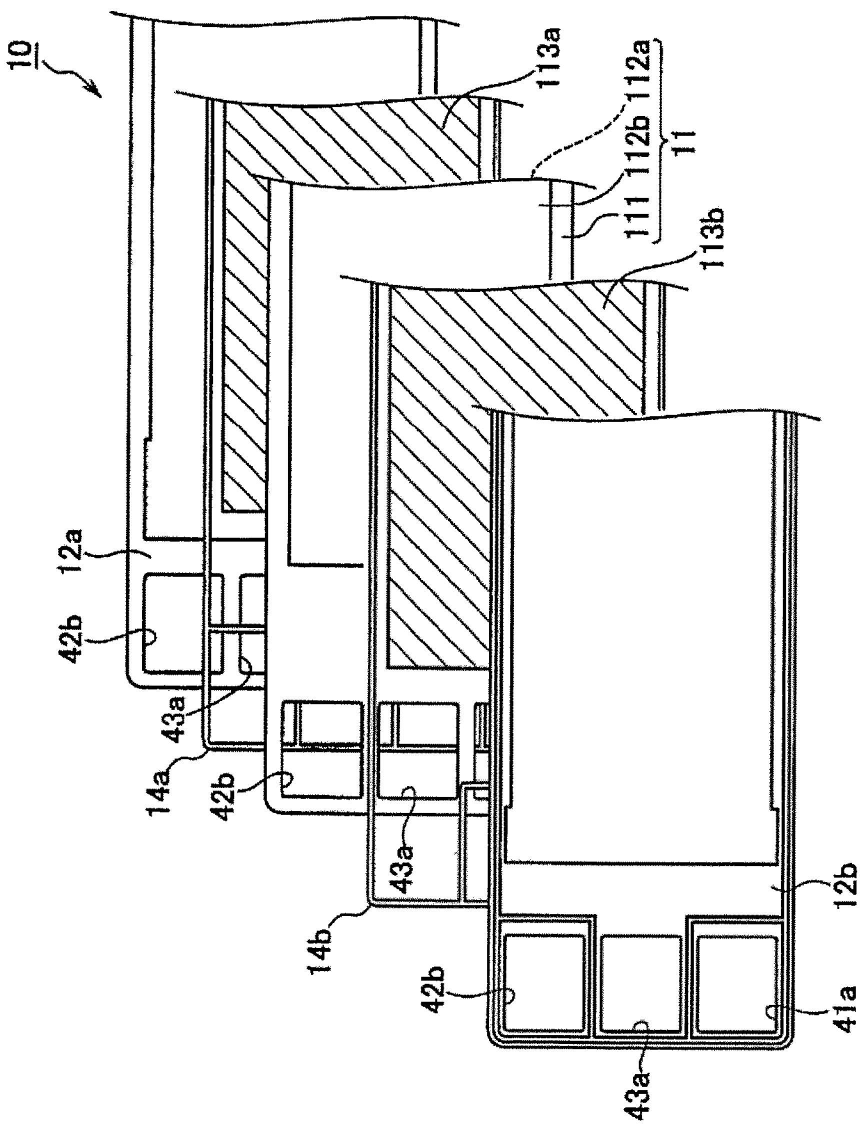
FIG. 1B is an exploded view showing a structure of power generation cells in the fuel cell.

FIG. 1A is an external perspective view of a fuel cell as a measurement target for an apparatus for measuring an impedance of a fuel cell according to the present invention. FIG. 1B is an exploded view showing a structure of power generation cells in the fuel cell.

As shown in FIG. 1A, a fuel cell stack 1 (hereinafter, referred to simply as a "fuel cell 1") is provided with a plurality of laminated power generation cells 10, current collecting plates 20, insulating plates 30, end plates 40, and four tension rods 50.

Each of the power generation cells 10 is a unit cell of the fuel cell. Each of the power generation cells 10 is configured to generate an electromotive voltage of about 1 volt (V), for example. A detailed structure of each of the power generation cells 10 will be described later.

The current collecting plates 20 are respectively arranged at the outer side of the plurality of laminated power generation cells 10. Each of the current collecting plates 20 is formed by a gas impermeable conductive member such as compact carbon, for example. The current collecting plates 20 include a positive electrode terminal 211 and a negative electrode terminal 212. A middle terminal 213 is also provided between the positive electrode terminal 211 and the negative electrode terminal 212. The middle terminal 213 may be provided at a middle point between the positive electrode terminal 211 and the negative electrode terminal 212 or may be provided at a position offset from the middle point. In the fuel cell stack 1, an electron $e^-$ generated in each of the power generation cells 10 is extracted therefrom and outputted by the positive electrode terminal 211 and the negative electrode terminal 212.

The insulating plates 30 are respectively arranged at the outer side of the current collecting plates 20. Each of the insulating plates 30 is formed by an insulating member such as rubber.

The end plates 40 are respectively arranged at the outer side of the insulating plates 30. Each of the end plates 40 is formed by a rigid metal material such as steel.

An anode supply port 41*a*, an anode discharge port 41*b*, a cathode supply port 42*a*, a cathode discharge port 42*b*, a cooling water supply port 43*a*, and a cooling water discharge port 43*b* are provided on one of the end plates 40 (the end plate 40 on a left-front side in FIG. 1A) are. In the present embodiment, the anode discharge port 41*b*, the cooling water discharge port 43*b*, and the cathode supply port 42*a* are arranged on a right side in FIG. 1A. The cathode discharge port 42*b*, the cooling water supply port 43*a* and the anode supply port 41*a* are also arranged on a left side in FIG. 1A.

The tension rods 50 are respectively arranged in the vicinity of four corners of the end plate 40. The fuel cell stack 1 is formed with holes (not shown in the drawings) that penetrate through the inside thereof. The tension rods 50 are respectively inserted into the through holes. Each of the tension rods 50 is formed by a rigid metal material such as steel. Insulation treatment is applied to a surface of each of the tension rods 50 so as to prevent an electric short circuit among the power generation cells 10. Each of the tension rods 50 is screwed with a nut (not shown because they are located at a rear side). The fuel cell stack 1 is squeezed in a laminating direction by means of the tension rods 50 and the nuts.

As examples of a method to supplying hydrogen serving as an anode gas to the anode supply port 41*a*, there are a method of directly supplying a hydrogen gas from a hydrogen storage device and a method of supplying a hydrogen-containing gas obtained by reforming a fuel containing hydrogen. It should be noted that the hydrogen storage device includes a high-pressure gas tank, a liquefied hydrogen tank, a hydrogen storage alloy tank, or other tanks. As the fuel containing hydrogen, there are a natural gas, methanol, gasoline and the like. Further, as a cathode gas to be supplied to the cathode supply port 42*a*, air is generally used.

As shown in FIG. 1B, the power generation cells 10 are structured by arranging an anode separator (an anode bipolar plate) 12*a* and a cathode separator (a cathode bipolar plate) 12*b* on both surfaces of a membrane electrode assembly (an MEA) 11.

In the MEA 11, electrode catalyst layers 112 are formed on both surfaces of an electrolyte membrane 111 made of an ion exchange membrane. A gas diffusion layer (GDL) 113 is formed on each of the electrode catalyst layers 112.

Each of the electrode catalyst layers 112 is formed by carbon black particles carrying platinum, for example.

Each of the GDLs 113 is formed by a member with sufficient gas diffusibility and conductivity, such as carbon fibers.

An anode gas supplied from the anode supply port 41*a* flows through the GDL 113 (113*a*) and reacts to the anode electrode catalyst layer 112 (112*a*), and is then discharged from the anode discharge port 41*b*.

A cathode gas supplied from the cathode supply port 42*a* flows through the GDL 113 (113*b*) and reacts to the cathode electrode catalyst layer 112 (112*b*), and is then discharged from the cathode discharge port 42*b*.

The anode separator 12*a* is laminated on one surface of the MEA 11 (a rear surface thereof in FIG. 1B) via the GDL 113*a* and a seal 14*a*. The cathode separator 12*b* is laminated on one surface of the MEA 11 (a front surface thereof in FIG. 1B) via the GDL 113*b* and a seal 14*b*. Each of the seals 14 (14*a* and 14*b*) is made of a rubber elastic material such as silicone rubber, ethylene-propylene rubber (ethylene propylene diene monomer: EPDM), and fluororubber. Each of the anode separator 12*a* and the cathode separator 12*b* is formed by press molding of a separator substrate made of metal such as stainless. A reactant gas flow path is formed on one surface thereof, and a cooling water flow path is formed on the opposite surface thereof so as to be arranged alternately with respect to the reaction gas flow path. As shown in FIG. 1B, the anode separator 12*a* and the cathode separator 12*b* are laminated on one another to form the cooling water flow path.

Each of the MEA 11, the anode separator 12*a* and the cathode separator 12*b* is formed with the holes 41*a*, 41*b*, 42*a*, 42*b*, 43*a* and 43*b*, and these holes are laminated on one another to form the anode supply port (an anode supply manifold) 41*a*, the anode discharge port (an anode discharge manifold) 41*b*, the cathode supply port (a cathode supply manifold) 42*a*, the cathode discharge port (a cathode discharge manifold) 42*b*, the cooling water supply port (a cooling water supply manifold) 43*a* and the cooling water discharge port (a cooling water discharge manifold) 43*b*.

Figure 2:
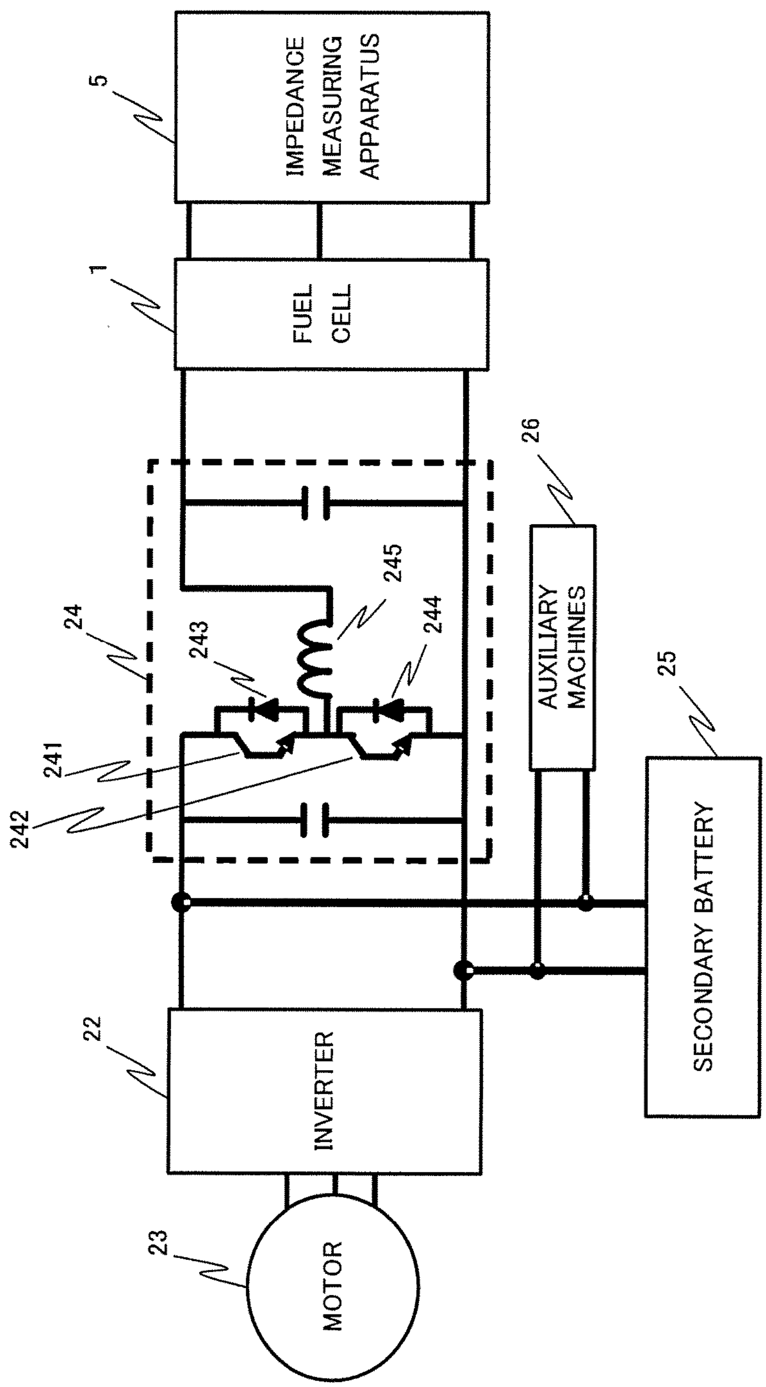
FIG. 2 is a system configuration diagram when the apparatus for measuring an impedance of a fuel cell according to one embodiment is mounted on a fuel cell vehicle.

FIG. 2 is a system configuration diagram when the apparatus for measuring an impedance of a fuel cell according to one embodiment is mounted on a fuel cell vehicle. A DC power outputted from the fuel cell 1 is converted into an electric power with a desired level by a DC/DC converter 24, and then is converted into an AC power by an inverter 22 to be supplied to a three-phase AC motor 23. Further, the fuel cell 1 is connected to a secondary battery 25 in parallel via the DC/DC converter 24. The DC power from the secondary battery 25 is supplied to auxiliary machines 26, and is converted into the AC power by the inverter 22 to be supplied to the three-phase AC motor 23. An impedance measuring apparatus (an apparatus for measuring an impedance) 5, which will be described later, is connected to the fuel cell 1.

The DC/DC converter 24 includes a step-down switch 241, a step-up switch 242, a flywheel diode 243, a flywheel diode 244, and a reactor 245. The step-down switch 241 and the step-up switch 242 are semiconductor switches and are IGBTs, for example. The flywheel diode 243 is connected in parallel in a direction opposite to the step-down switch 241. The flywheel diode 244 is connected in parallel in a direction opposite to the step-up switch 242.

One end of the reactor 245 is connected to a connecting point where the step-down switch 241 is connected to the step-up switch 242. The other end is connected to a positive electrode side of the fuel cell 1. The DC/DC converter generally includes a reactor due to its functionality. This reactor can be used as the reactor 245.

In the present embodiment, it is assumed that a voltage at the DC/DC converter 24 on the inverter 22 side is higher than a voltage at the DC/DC converter 24 on the fuel cell 1 side. As shown in FIG. 2, the semiconductor switches (the step-down switch 241 and the step-up switch 242) are provided on the inverter 22 side of both ends of the reactor 245, but no semiconductor switch is provided on the fuel cell 1 side.

Figure 3:
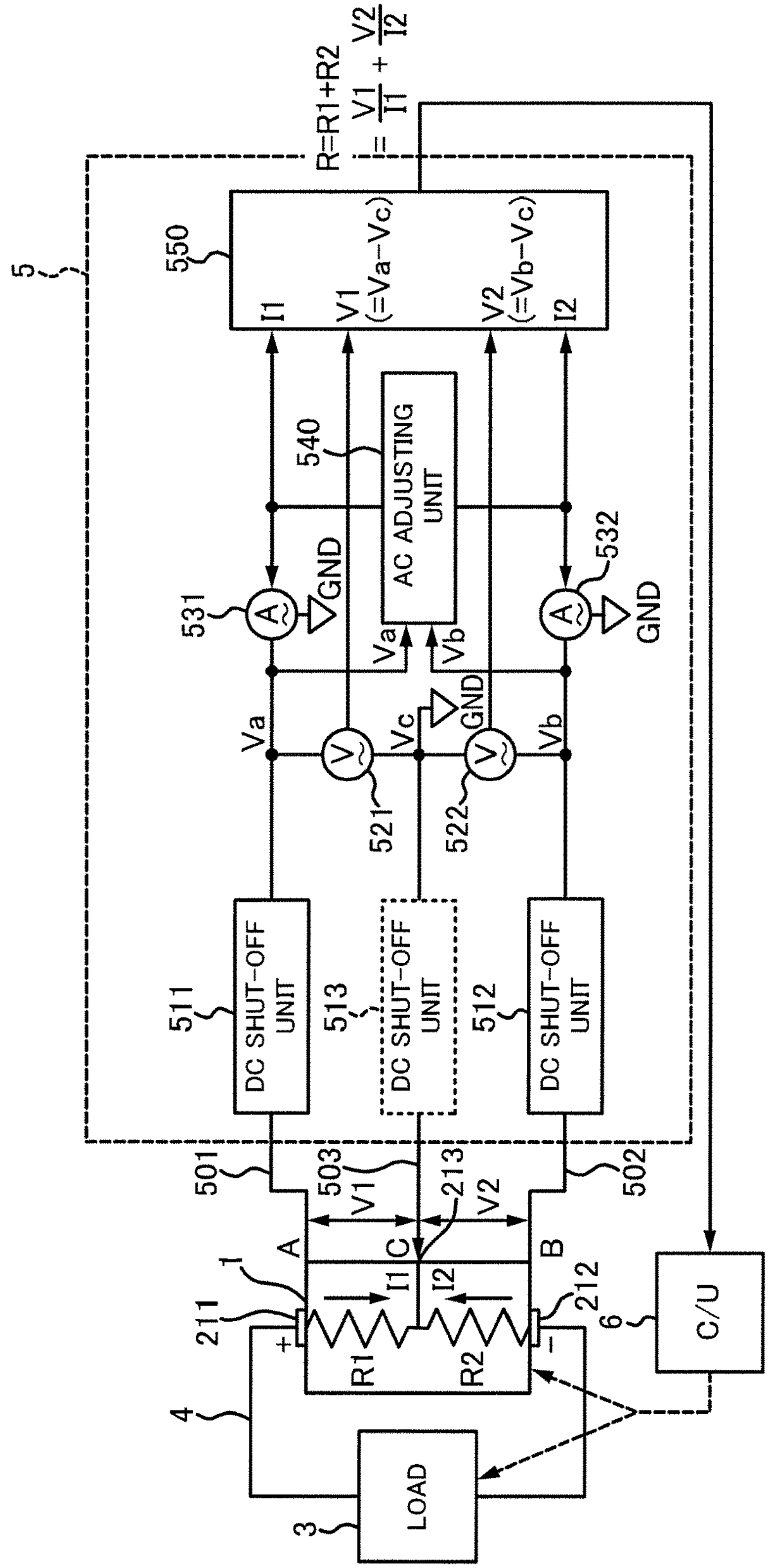
FIG. 3 is a circuit diagram of the apparatus for measuring an impedance of a fuel cell according to one embodiment.

FIG. 3 is a circuit diagram of the impedance measuring apparatus 5 for fuel cell according to one embodiment. The impedance measuring apparatus 5 includes a positive electrode DC shut-off unit 511, a negative electrode DC shut-off unit 512, a midpoint DC shut-off unit 513, a positive-electrode side AC potential difference detecting unit 521, a negative-electrode side AC potential difference detecting unit 522, a positive-electrode side power supply unit 531, a negative-electrode side power supply unit 532, an AC adjusting unit 540, and an impedance calculating unit 550.

Figure 4:
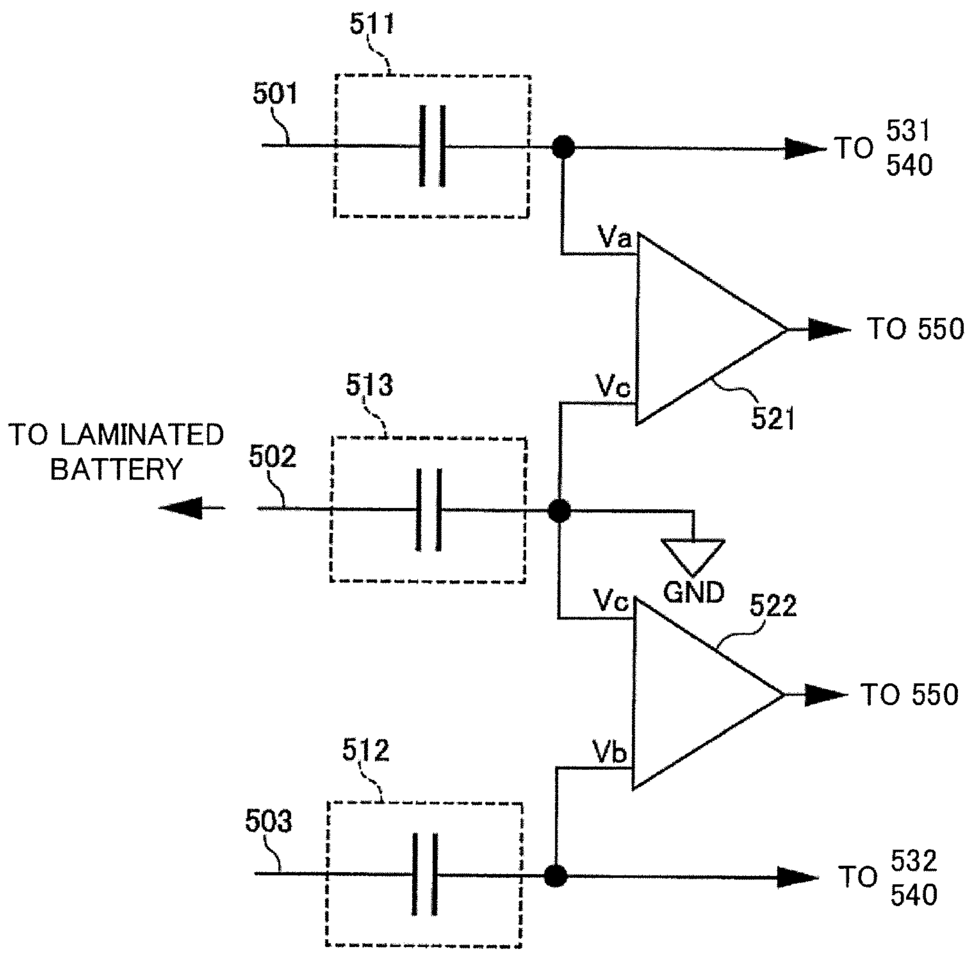
FIG. 4 is a drawing showing a detailed configuration of a positive electrode DC shut-off unit, a negative electrode DC shut-off unit, a midpoint DC shut-off unit, a positive-electrode side AC potential difference detecting unit, and a negative-electrode side AC potential difference detecting unit.

Details of the positive electrode DC shut-off unit 511, the negative electrode DC shut-off unit 512, the midpoint DC shut-off unit 513, the positive-electrode side AC potential difference detecting unit 521, and the negative-electrode side AC potential difference detecting unit 522 will be described with reference to FIG. 4.

The positive electrode DC shut-off unit 511 is connected to the positive electrode terminal 211 of the fuel cell 1. The negative electrode DC shut-off unit 512 is connected to the negative electrode terminal 212 of the fuel cell 1. The midpoint DC shut-off unit 513 is connected to the middle terminal 213 of the fuel cell 1. It should be noted that the midpoint DC shut-off unit 513 may not be provided as shown by a wavy line in FIG. 3. These DC shut-off units 511 to 513 shut off DC signals, but allow AC signals to flow. The DC shut-off units 511 to 513 are capacitors or transformers, for example.

AC potential Va in the positive electrode terminal 211 of the fuel cell 1 and AC potential Vc in the middle terminal 213 thereof are inputted to the positive-electrode side AC potential difference detecting unit 521, and the positive-electrode side AC potential difference detecting unit 521 then outputs a positive-electrode side AC potential difference. AC potential Vb in the negative electrode terminal 212 of the fuel cell 1 and the AC potential Vc in the middle terminal 213 thereof are inputted to the negative-electrode side AC potential difference detecting unit 522, and the negative-electrode side AC potential difference detecting unit 522 then outputs a negative-electrode side AC potential difference. The positive-electrode side AC potential difference detecting unit 521 and the negative-electrode side AC potential difference detecting unit 522 are differential amplifiers (instrumentation amplifiers), for example.

Details of the positive-electrode side power supply unit 531 and the negative-electrode side power supply unit 532 will be described with reference to FIG. 5.

Figure 5:
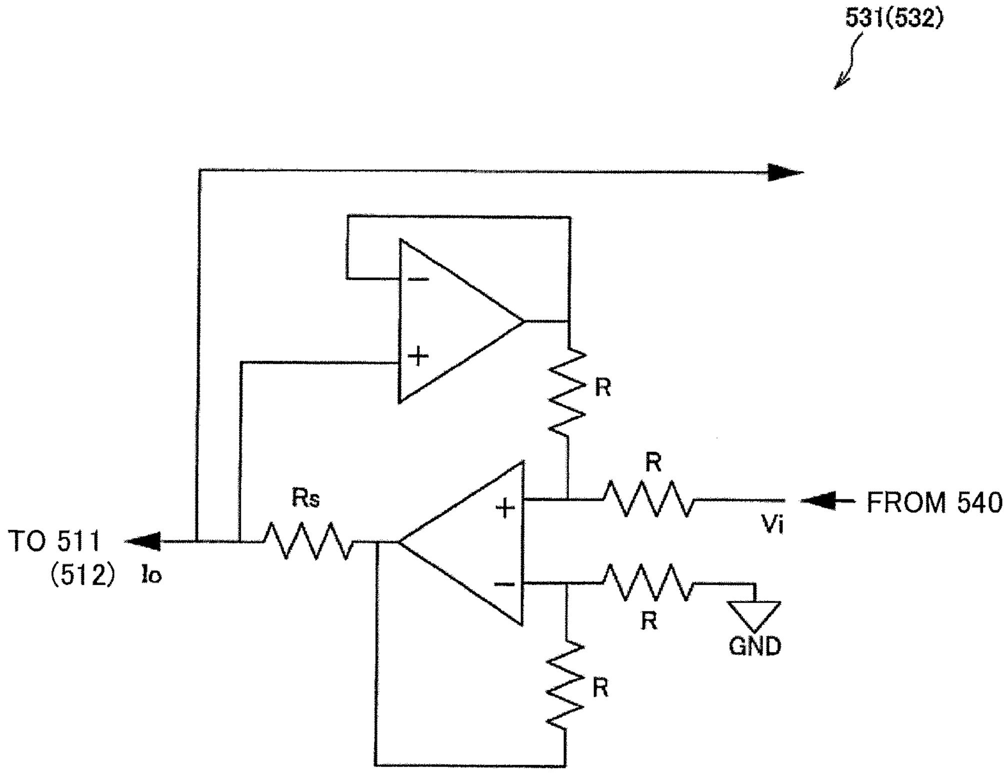
FIG. 5 is a drawing showing a detailed configuration of a positive-electrode side power supply unit and a negative-electrode side power supply unit.

The positive-electrode side power supply unit 531 can be achieved by a voltage/current conversion circuit constructed by operational amplifiers (OP amplifiers) as shown in FIG. 5, for example. According to this circuit, a current Io proportional to an input voltage Vi is outputted. It should be noted that Io is obtained by dividing Vi by Rs, which is a current sensing resistance. That is, this voltage/current conversion circuit is a variable AC current source capable of adjusting an output current Io according to the input voltage Vi.

It is possible to obtain the output current Io by dividing the input voltage Vi by a proportionality factor Rs by means of this circuit without actual measurement of the output current Io. Further, even if an element that generates a phase angle such as a capacitor is interposed in a current path, an AC current flowing through a group of the laminated cells is brought into the identical phase as an output of the current source because the output is the current. The current is also brought into the identical phase as the input voltage Vi. Accordingly, the circuit is simplified with no necessity of considering a phase difference in impedance calculation in a next stage. In addition, even if a capacitor arranged in the current path has variable impedance, it is not affected by a phase change. Due to these reasons, it is preferable that the circuit as shown in FIG. 5 is used as the positive-electrode side power supply unit 531. The same shall apply to the negative-electrode side power supply unit 532.

Details of the AC adjusting unit 540 will be described with reference to FIG. 6.

Figure 6:
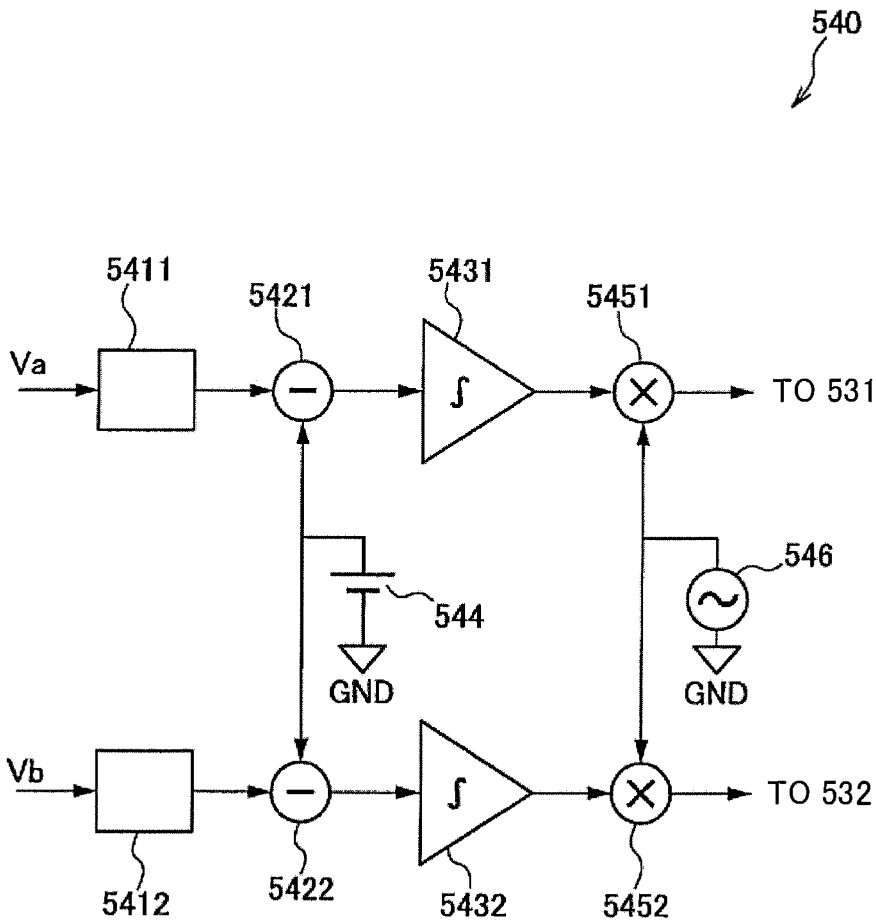
FIG. 6 is a drawing showing a detailed configuration of an AC adjusting unit.

The AC adjusting unit 540 can be achieved by a PI control circuit as shown in FIG. 6, for example. The AC adjusting unit 540 includes a positive electrode side detector circuit 5411, a positive electrode side subtracter 5421, a positive electrode side integrating circuit 5431, a positive electrode side multiplier 5451, a negative electrode side detector circuit 5412, a negative electrode side subtracter 5422, a negative electrode side integrating circuit 5432, a negative electrode side multiplier 5452, a reference voltage 544 and an AC signal source 546.

The positive electrode side detector circuit 5411 removes an unnecessary signal from the AC potential Va on a wiring of the positive-electrode side power supply unit 531 connected to the positive electrode terminal 211 of the fuel cell 1, and converts it into a DC signal.

The positive electrode side subtracter 5421 detects a difference between the DC signal and the reference voltage 544. The positive electrode side integrating circuit 5431 averages a signal outputted from the positive electrode side subtracter 5421 or adjusts sensitivity of the signal.

The positive electrode side multiplier 5451 modulates amplitude of the AC signal source 546 on the basis of an output of the positive electrode side integrating circuit 5431.

The AC adjusting unit 540 thus generates a command signal for the positive-electrode side power supply unit 531. The AC adjusting unit 540 also generates a command signal for the negative-electrode side power supply unit 532 in the similar manner. By increasing or decreasing outputs of the positive-electrode side power supply unit 531 and the negative-electrode side power supply unit 532 in accordance with thus generated command signals, both of the AC potentials Va and Vb are controlled to a predetermined level. Therefore, the AC potentials Va and Vb become equipotential.

It should be noted that an analog arithmetic integrated circuit is illustrated as an example of the circuit configuration in this example, but the circuit may be configured to a digital control circuit after digital conversion of the AC potential Va (Vb) by means of an AD converter.

Figure 7:
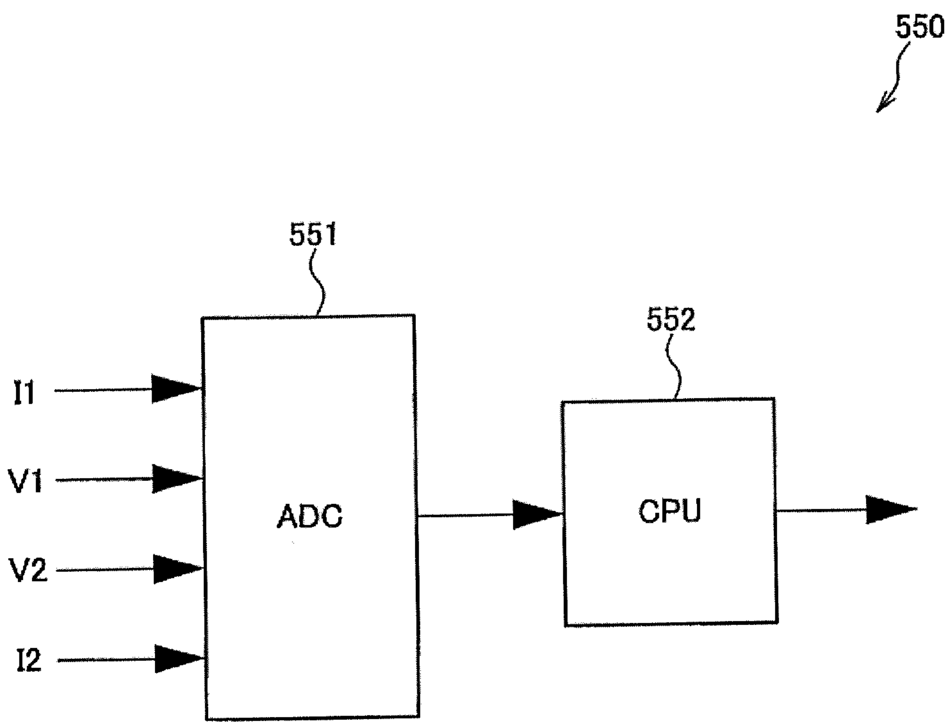
FIG. 7 is a drawing showing a detailed configuration of an impedance calculating unit.

Details of the impedance calculating unit 550 will be described with reference to FIG. 7.

The impedance calculating unit 550 includes an AD converter (ADC) 551 and a microcomputer chip (CPU) 552.

The AD converter 551 respectively converts AC currents (I1, I2) and AC voltages (V1, V2), which are analog signals, into digital value signals to be transferred to the microcomputer chip 552.

The microcomputer chip 552 stores programs to calculate impedance Rn and whole impedance R of the fuel cell in advance. The microcomputer chip 552 carries out sequential operations at predetermined micro time intervals or outputs operation results in response to a request of a control unit 6.

It should be noted that the impedance Rn and the whole impedance R of the fuel cell are calculated by the following formula. In the present embodiment, n=2.

[Mathematical Formula 1]

$$Rn = \frac{Vn}{In}(n = 1, 2, \ldots , n) \quad (1\text{-}1)$$

$$R = \sum Rn \quad (1\text{-}2)$$

The impedance calculating unit 550 may also be achieved by an analog arithmetic circuit using an analog arithmetic integrated circuit. With the analog arithmetic circuit, continuous impedance changes in terms of time can be output.

Figure 8:
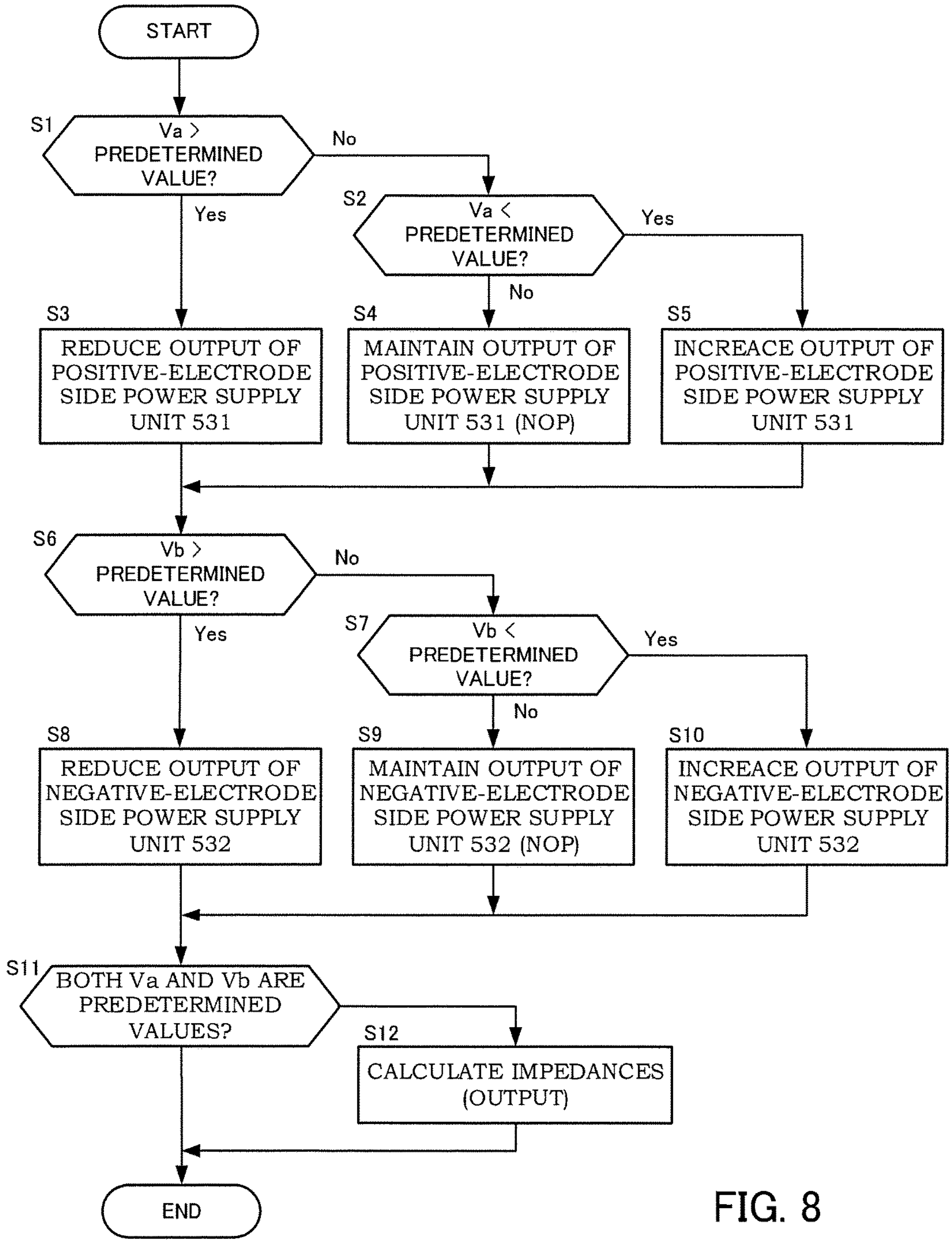
FIG. 8 is a control flowchart mainly to be executed by a control unit in the apparatus for measuring an impedance of a fuel cell.

FIG. 8 is a control flowchart mainly to be executed by the control unit 6 in the apparatus for measuring an impedance of a fuel cell.

At Step S1, the control unit 6 determines whether the positive electrode AC potential Va is larger than a predetermined value or not. When the determination result is negation, the control unit 6 causes the processing flow to shift to Step S2. When the determination result is affirmation, the control unit 6 causes the processing flow to shift to Step S3.

At Step S2, the control unit 6 determines whether the positive $$Rn = \frac{Vn}{In}(n = 1, 2, \ldots , n) \quad (1\text{-}1)$$

$$R = \sum Rn \quad (1\text{-}2)$$

electrode AC potential Va is less than a predetermined value or not. When the determination result is negation, the control unit 6 causes the processing flow to shift to Step S4. When the determination result is affirmation, the control unit 6 causes the processing flow to shift to Step S5.

At Step S3, the control unit 6 causes the positive-electrode side power supply unit 531 to reduce an output. Therefore, the positive electrode AC potential Va decreases.

At Step S4, the control unit 6 causes the positive-electrode side power supply unit 531 to maintain an output. Therefore, the positive electrode AC potential Va is maintained.

At Step S5, the control unit 6 causes the positive-electrode side power supply unit 531 to increase an output. Therefore, the positive electrode AC potential Va rises.

At Step S6, the control unit 6 determines whether the negative electrode AC potential Vb is larger than a predetermined value or not. When the determination result is negation, the control unit 6 causes the processing flow to shift to Step S7. When the determination result is affirmation, the control unit 6 causes the processing flow to shift to Step S8.

At Step S7, the control unit 6 determines whether the negative electrode AC potential Vb is less than a predetermined value or not. When the determination result is negation, the control unit 6 causes the processing flow to shift to Step S9. When the determination result is affirmation, the control unit 6 causes the processing flow to shift to Step S10.

At Step S8, the control unit 6 causes the negative-electrode side power supply unit 532 to reduce an output. Therefore, the negative electrode AC potential Vb decreases.

At Step S9, the control unit 6 allows the negative-electrode side power supply unit 532 to maintain an output. Therefore, the negative electrode AC potential Vb is maintained.

At Step S10, the control unit 6 causes the negative-electrode side power supply unit 532 to increase an output. Therefore, the negative electrode AC potential Vb rises.

At Step S11, the control unit 6 determines whether each of the positive electrode AC potential Va and the negative electrode AC potential Vb is a predetermined value or not. When the determination result is affirmation, the control unit 6 causes the processing flow to shift to Step S12. When the determination result is negation, the control unit 6 exits from the process.

At Step S12, the impedance calculating unit 550 calculates impedances on the basis of the above formulae (1-1) and (1-2).

Figure 9A:
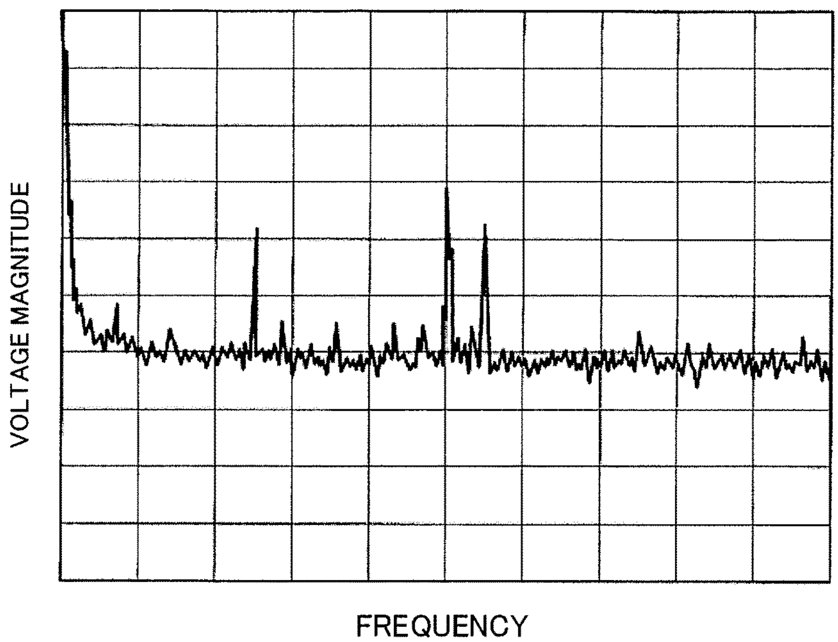
FIG. 9A is a drawing showing one example of an experimental result that shows an increase in frequencies each of which has large amplitude in accordance with an increase in a load when a voltage between both ends of the fuel cell is measured in a state that the load is low.
Figure 9B:
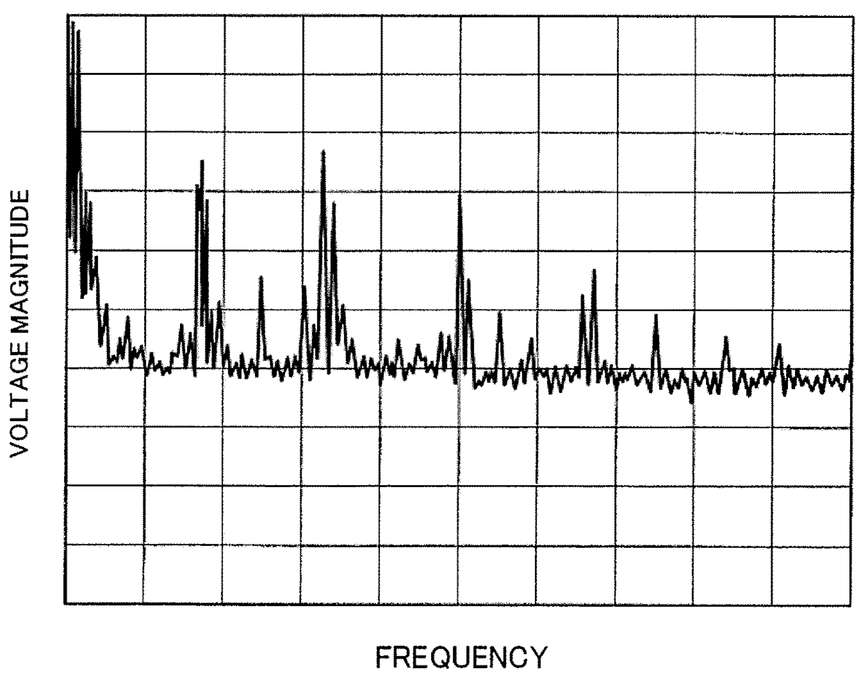
FIG. 9B is a drawing showing another example of an experimental result that shows an increase in frequencies each of which has large amplitude in accordance with an increase in a load when a voltage between both ends of the fuel cell is measured in a state that the load is low.

FIG. 9A and FIG. 9B are drawings showing an example of an experimental result that shows an increase in frequencies each of which has large amplitude in accordance with an increase in a load when a voltage between both ends of the fuel cell 1 is measured with the configuration of the conventional device (WO2012/077450A). FIG. 9A shows the result in the case of a low load. FIG. 9B shows the result in the case of a high load. As shown in FIG. 9B, when a load increases, the frequencies each of which has large amplitude increase in accordance with variation in the load. For this reason, a case where the frequency of the AC signal to be outputted to the fuel cell 1 matches the frequency of load variation occurs. This causes the AC signal applied to the positive electrode terminal and the negative electrode terminal of the fuel cell 1 to flow to the load side.

In the present embodiment, by providing the reactor 245 inside the DC/DC converter 24, specifically, on the fuel cell 1 side with respect to the semiconductor switches (the step-down switch 241 and the step-up switch 242) provided in the DC/DC converter 24, the positive-electrode side AC potential difference and the negative-electrode side AC potential difference are suppressed from being different from each other at the time of the load variation. That is, as the frequency of load variation increases, the impedance of the reactor 245 becomes higher. Therefore, the impedance between the load and the fuel cell 1 becomes higher than the impedance between the load and the secondary battery 25. This causes the variation in the load to be absorbed into the secondary battery 25 side. For this reason, it is possible to suppress the values of the positive-electrode side AC potential difference and the negative-electrode side AC potential difference of the fuel cell 1 from being different from each other. This makes it possible to suppress the AC signals applied to the positive electrode terminal and the negative electrode terminal of the fuel cell 1 from flowing to the load side.

It should be noted that switching of a semiconductor switch arranged in the inverter 22 and switching of the semiconductor switches (the step-down switch 241 and the step-up switch 242) arranged in the DC/DC converter 24 are included in the variation in the load, for example. For example, the variation frequencies of the load are a switching frequency of the semiconductor switch arranged in the inverter 22 and switching frequencies of the step-down switch 241 and the step-up switch 242 arranged in the DC/DC converter 24.

As the frequencies (the measured frequencies) of the AC signal outputted from the positive-electrode side power supply unit 531 and the negative-electrode side power supply unit 532, a frequency appropriate to measure the impedance of the fuel cell 1 is set. To absorb the variation in the load by the secondary battery 25 side at this measured frequency or near the measured frequency, the impedance between the load and the fuel cell 1 needs to be higher than the impedance between the load and the secondary battery 25. Therefore, as the reactor 245 arranged inside the DC/DC converter 24, one that has the impedance so that at least the impedance between the load and the fuel cell 1 is higher than the impedance between the load and the secondary battery 25 at the measured frequency or near the measured frequency is used.

As described above, the apparatus for measuring an impedance of a fuel cell according to one embodiment is used for the system that includes the fuel cell 1, the secondary battery 25, and the load to which the electric power is supplied from at least one of the fuel cell 1 and the secondary battery 25. The apparatus for measuring an impedance of a fuel cell adjusts the AC current outputted to the fuel cell 1 so that the positive-electrode side AC potential difference, which is the difference between the electric potential of the fuel cell 1 on the positive electrode side and the middle electric potential, matches the negative-electrode side AC potential difference, which is the difference between the electric potential of the fuel cell 1 on the negative electrode side and the middle electric potential. The apparatus for measuring an impedance of a fuel calculates the impedance of the fuel cell 1 on the basis of the adjusted AC current and at least one AC potential differences of the positive-electrode side AC potential difference and the negative-electrode side AC potential difference. The impedance adjusting unit (the reactor 245) is provided to adjust the impedance so that the impedance between the fuel cell 1 and the load becomes higher than the impedance between the secondary battery 25 and the load at the frequency of the AC current outputted to the fuel cell 1. Accordingly, even if the load varies and noise is generated, the noise flows to the secondary battery 25 side where the impedance is low. This makes it possible to maintain the state of matching the positive-electrode side AC potential difference with the negative-electrode side AC potential difference, and it is possible to obtain the impedance of the fuel cell 1 with accuracy.

As the impedance adjusting unit, the reactor 245, which is disposed between the fuel cell 1 and the load, having a reactance component is used. Accordingly, compared with the case of using a resistor as the impedance adjusting unit, it is possible to reduce an amount of heat loss.

Especially, the apparatus for measuring an impedance of a fuel cell according to one embodiment uses the reactor 245 disposed inside the DC/DC converter 24 as the impedance adjusting unit. This eliminates the need for additionally disposing the impedance adjusting unit, thereby allowing reduction in cost.

In the present embodiment, the voltage of the DC/DC converter 24 on the load side is higher than the voltage of the DC/DC converter 24 on the fuel cell 1 side. The semiconductor switches in the DC/DC converter 24 are disposed on the load side with respect to the reactor 245 and are not disposed on the fuel cell 1 side. In the case where the semiconductor switches are disposed on the fuel cell 1 side with respect to the reactor 245, turning on/off these semiconductor switches possibly results in a mismatch between the positive-electrode side AC potential difference with the negative-electrode side AC potential difference, failing to obtaining the impedance of the fuel cell 1 with accuracy. However, by providing the semiconductor switches on the load side not on the fuel cell 1 side, it is possible to prevent turning on/off the semiconductor switches from affecting the fuel cell 1 side via the reactor 245. This makes it possible to obtain the impedance of the fuel cell 1 with accuracy.

The present invention is not limited to the embodiment described above. For example, the circuit diagram of the impedance measuring apparatus 5 for fuel cell is not limited to the circuit shown in FIG. 3. In the embodiment described above, the AC potential difference detecting units 521 and 522 and the power supply units 531 and 532 are connected to the fuel cell 1 through one route. However, these members may be connected thereto through different routes, respectively. A connection switching device for switching the connected midpoint can be disposed to sequentially switch the midpoint.

Moreover, the following configuration is also applicable. Two fuel cells 1A and 1B are connected in series. The positive electrode of the fuel cell 1A is defined as the positive electrode in the embodiment described above, the connecting point where the fuel cell 1A is connected to the fuel cell 1B as the midpoint in the embodiment described above, and the negative electrode of the fuel cell 1B as the negative electrode in the embodiment described above. In this case, an internal impedance of the fuel cell 1A can be obtained as R1, and an internal impedance of the fuel cell 1B can be obtained as R2.

Figure 10:
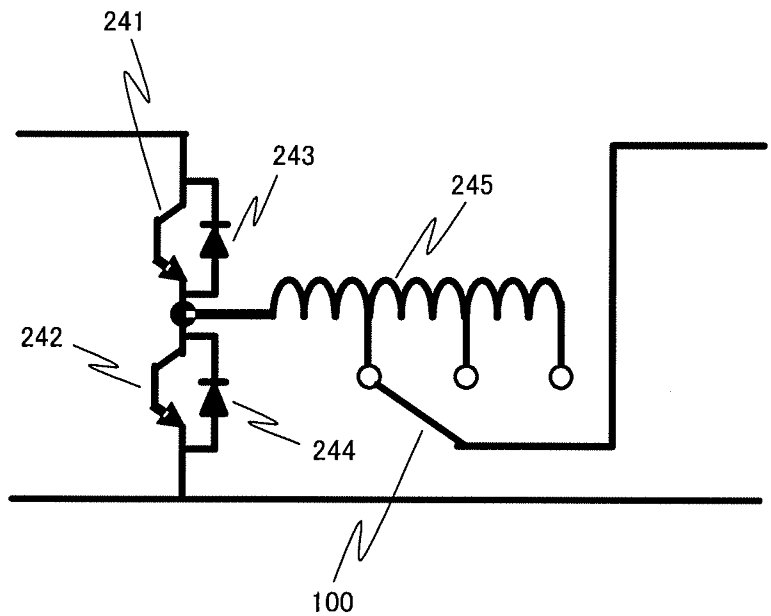
FIG. 10 is a drawing showing a configuration example where a switch tap is provided and a connecting point where the switch tap is connected to a reactor is changed in accordance with a magnitude of the load.

A configuration that changes the impedance between the load and the fuel cell 1 according to the magnitude of the load is also applicable. FIG. 10 is a drawing showing a configuration example where a switch tap 100 is provided and a connecting point where the switch tap 100 is connected to the reactor 245 is changed in accordance with the magnitude of the load. FIG. 10 shows a part of the internal constitution of the DC/DC converter 24. The reactor 245 has the three connecting points with the switch tap 100. In a case where the load is small, the switch tap 100 is connected to the connecting point on the left of the drawing. With the load of medium magnitude, the switch tap 100 is connected to the middle connecting point. With the large load, the switch tap 100 is connected to the connecting point on the right of the drawing. Thus, the apparatus is configured so that, in a case where the load is large, the impedance between the load and the fuel cell 1 becomes higher than the impedance between the load and the secondary battery 25, whereby it is possible to measure the impedance of the fuel cell 1 with accuracy. In a case where the load is small, a loss of the DC/DC converter 24 can be reduced.

In the embodiment described above, the case where the reactor 245 is provided as the impedance adjusting unit to adjust the impedances so that the impedance between the fuel cell 1 and the load becomes higher than the impedance between the secondary battery 25 and the load at the frequency of the AC current outputted to the fuel cell 1 has been described as an example. However, the impedance adjusting unit is not limited to the reactor.

The invention claimed is:

1. An apparatus for measuring an impedance of a fuel cell, the apparatus being used for a system that includes a fuel cell, a secondary battery, and a load device connected to the fuel cell and the secondary battery, the apparatus comprising:

- an AC power supply unit configured to output an AC current to the fuel cell;
- an AC adjusting unit configured to adjust the AC current so that a positive-electrode side AC potential difference matches a negative-electrode side AC potential difference, the positive-electrode side AC potential difference being a difference between an electric potential of the fuel cell on a positive electrode side and a middle electric potential, the negative-electrode side AC potential difference being a difference between an electric potential of the fuel cell on a negative electrode side and the middle electric potential, the middle electric potential being an electric potential at a midpoint between a positive electrode and a negative electrode of the fuel cell;

an impedance calculating unit configured to calculate an impedance of the fuel cell on a basis of the adjusted AC current and at least one AC potential difference of the positive-electrode side AC potential difference and the negative-electrode side AC potential difference; and an impedance adjusting unit configured to adjust the impedance of the fuel cell so that an impedance obtained by synthesizing an impedance of a route between the fuel cell and the load device and the impedance of the fuel cell becomes higher than an impedance obtained by synthesizing an impedance of a route between the secondary battery and the load device and the impedance of the fuel cell at a frequency of the AC current output from the AC power supply unit.

2. The apparatus for measuring an impedance of a fuel cell according to claim 1, wherein the impedance adjusting unit is constituted from a reactance component arranged between the fuel cell and the load device.

3. The apparatus for measuring an impedance of a fuel cell according to claim 1, wherein the impedance adjusting unit is constituted from a reactor disposed inside a power converter, the power converter being configured to convert an electric power from the fuel cell into a second electric power.

4. The apparatus for measuring an impedance of a fuel cell according to claim 3, wherein a voltage of the power converter on a load device side is higher than a voltage of the power converter on a fuel cell side, and wherein a semiconductor switch in the power converter is arranged on the load device side with respect to the reactor and is not arranged on the fuel cell side.

5. A method of measuring an impedance of a fuel cell, the method being used for a system that includes a fuel cell, a secondary battery, and a load device connected to the fuel cell and the secondary battery, the method comprising:

outputting an AC current to the fuel cell;

adjusting an impedance of the fuel cell so that an impedance obtained by synthesizing an impedance of a route between the fuel cell and the load device and the impedance of the fuel cell becomes higher than an impedance obtained by synthesizing an impedance of a route between the secondary battery and the load device and the impedance of the fuel cell at a frequency of the AC current output to the fuel cell;

adjusting the AC current so that a positive-electrode side AC potential difference matches a negative-electrode side AC potential difference, the positive-electrode side AC potential difference being a difference between an electric potential of the fuel cell on a positive electrode side and a middle electric potential, the negative-electrode side AC potential difference being a difference between an electric potential of the fuel cell on a negative electrode side and the middle electric potential, the middle electric potential being an electric potential at a midpoint between a positive electrode and a negative electrode of the fuel cell; and calculating an impedance of the fuel cell on a basis of the adjusted AC current and at least one AC potential difference of the positive-electrode side AC potential difference and the negative-electrode side AC potential difference.

* * * * *